United States Patent [19]

Fiori, Jr.

[11] Patent Number: 5,386,148

[45] Date of Patent: Jan. 31, 1995

[54] SIGNAL CONDITIONING APPARATUS

[76] Inventor: David Fiori, Jr., P.O. Box 266, Yardley, Pa. 19067

[21] Appl. No.: 879,941

[22] Filed: May 8, 1992

[51] Int. Cl.$^6$ ............................................. H04B 3/28
[52] U.S. Cl. ..................................... 307/89; 307/91
[58] Field of Search ............................... 333/12, 172; 307/89-91, 104, 105, 108, 491, 498, 520, 521; 328/165, 167; 381/94

[56] References Cited

U.S. PATENT DOCUMENTS

| | | | |
|---|---|---|---|
| 3,394,269 | 7/1968 | Miner | 333/12 |
| 4,571,554 | 2/1986 | Martin et al. | 330/252 |
| 4,621,200 | 11/1986 | Lovrenich . | |
| 4,922,536 | 5/1990 | Hoque . | |
| 4,979,218 | 12/1990 | Strahm | 381/94 |
| 5,146,506 | 9/1992 | Sasaki | 381/94 |
| 5,170,081 | 12/1992 | Adachi et al. | 307/520 |

OTHER PUBLICATIONS

"Grounding and Shielding Techniques in Instrumentation", Ralph Morrison, 3rd Edition, 1986, Wiley-Interscience, pp. 69-71.

Primary Examiner—A. D. Pellinen
Assistant Examiner—Fritz M. Fleming
Attorney, Agent, or Firm—Dilworth & Barrese

[57] ABSTRACT

A signal conditioning circuit having an input stage that receives inputs from at least one pair of conductors and processes the input signal through an input filter and a buffer amplifier. Each input filter and buffer amplifier are powered by independent power sources whose power return reference potentials are independently determined by the potential of the corresponding input signal potential reference conductor. The outputs of the buffer amplifiers, the power return reference potentials, and the power return reference potential of the conditioning circuit output are all appropriately added or subtracted in an output stage. The output stage consists of an amplifier buffer having low output impedance which is powered by a separate independent power source whose power return reference potential is independently determined by the potential of the output signal reference conductor. The output of this circuit stage is connected to an output inductor circuit which in turn drives the output signal conductor. The output stage further includes a filter which is designed to maintain stability and reject external influences on the output of the output amplifier buffer. The invention also includes means that connect the reference potential of the destination of the output conductors to the system power ground potential. The invention also applies to arrays of such signal conditioning apparatus.

20 Claims, 3 Drawing Sheets

SIGNAL CONDITIONING APPARATUS

BACKGROUND OF THE INVENTION

1. Field of the Invention

The present invention relates to a signal conditioning apparatus that serves to eliminate electrical and/or magnetic interferences which develop during transmission of electrical signals. In addition, the signal conditioning apparatus also serves to drive output conductors in such a way as to overcome the adverse effects of loading caused by the output conductors on the signal source.

2. Description of the Related Art

Conductors that provide an electrical connection between devices in a system are often the source of many types of electrical interference. Magnetic fields, electric fields and electro-magnetic or radio frequency fields are known to interfere with the fidelity of signals conveyed over conductors which are subjected to those fields. Furthermore, the ground or reference conductor of a typical signal carrying pair of conductors is often connected to different local ground potentials between one end of the conductor as compared to the other, and currents are known to flow in such conductors which then produce voltage drops on that conductor which also interfere with the fidelity of the signals being conveyed. In addition, these conductors; especially when very long, present loads to the signal source that may adversely effect the fidelity of the signal.

The problems of conveying signals over conductor pairs are well known. The conveyance of signals, especially between powered devices, is often plagued by electrical and/or magnetic interference. One method employed to reduce these interferences modulates the signal so that it can be easily separated from the interference, and then demodulates at the destination. For example, an analog to digital converter can be utilized to convey digital impulses over the connecting conductors instead of analog voltage potentials. The destination device in such instances must then convert the signal back to an analog signal potential. Such approaches, while very effective, can be very costly, and require extensive circuitry at both the sending and receiving ends of the conductors. Such methods are exemplified by U.S. Pat. No. 4,922,536.

One common method to reduce these interferences is to convey such signals in a differential manner. A common approach utilizes a three conductor shielded cable where two of the conductors deliver the signal and its arithmetic inverse, and the third conductor, usually a shield, conveys the ground reference potential voltage. The conditioning circuit, usually placed at the destination end of the conductors, forms the difference between the potential of the first signal carrying conductor and the second signal carrying conductor. In theory, both conductors are subject to the same interferences, and the subtraction of the signals as conveyed will eliminate the common mode noises. This approach, while very effective in eliminating most interference is nevertheless expensive and difficult to implement. To adapt this approach in the general case of processing signals between subsystems requires active circuitry at the sending end to form the inverse signal, and active circuitry at the receiving end to subtract the signals. Multiple conductors are also required to be contained within a single shield, which is more costly than conductors having only one conductor surrounded by a shield.

One source of interference in the conveyance of these differential signals between electronic subsystems is referred to as the ground loop. Because it is common for there to be multiple electronic paths between the reference potentials of each subsystem, and since such paths commonly include sources of interference, these alternative paths are often responsible for the interference present in those systems. Such ground loops are generally overcome by eliminating any electrical connection by conductors between the subsystems. Ralph Morrison in his book entitled "GROUNDING AND SHIELDING TECHNIQUES IN INSTRUMENTATION", Ralph Morrison, 3rd Ed., 1986, Wiley-Interscience, pgs. 69–71, teaches art that eliminates the effects of the electrical connections between subsystems that convey their signals by differential means through the use of tandem differential amplifiers powered by electrically isolated power supplies. A first differential amplifier calculates the difference between the signals being conveyed, and the second differential amplifier adds the reference potential of the destination to the result of the first differential amplifier. The result is that the reference potentials of the source of the differential signal may differ from the reference potential of the destination without effecting the expression of the signal at the destination. However, such an approach is not easily adapted to electronic systems consisting of single ended two wire signal conductors. Consequently, this approach suffers from the same limitations as devices that convey signals by differential means.

Therefore, a need exists for a signal conditioning system which receives electrical signals, and suppresses interference, such as electric and/or magnetic fields which may interfere with the re-transmission of the received electrical signals.

SUMMARY OF THE INVENTION

The present invention relates to a signal conditioning apparatus which includes an input portion for receiving electrical signals and corresponding return reference potential signals and for generating an intermediate electrical signal proportional to the potential difference between the received electrical signal and the return reference potential signal. An output portion is also provided which connects to the intermediate electrical signal and transmits a destination signal and a corresponding destination return potential signal, such that the destination signal is the resultant of the intermediate electrical signal minus the received return reference potential signal plus the destination return potential signal.

BRIEF DESCRIPTION OF THE DRAWINGS

Preferred embodiments of the invention are described hereinbelow with reference to the drawings wherein.

DETAILED DESCRIPTION OF THE PREFERRED EMBODIMENTS

Figure 1:
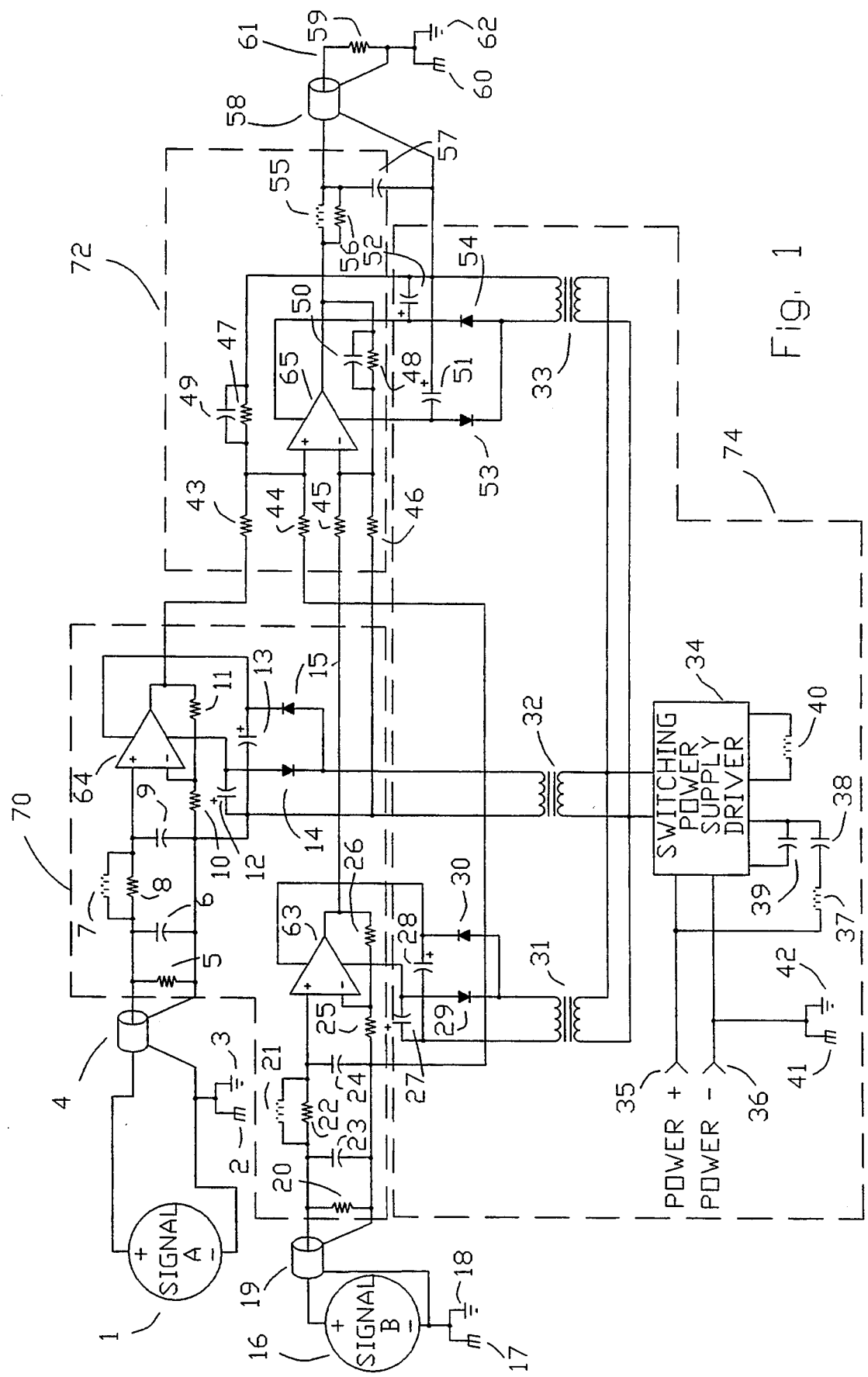
FIG. 1 is a circuit diagram of the signal conditioning apparatus of the present invention.

Referring to FIG. 1, the signal conditioning apparatus of the present invention includes input stage 70, output stage 72 and isolating power supplier system 74.

Input portion 70 is arranged to receive signal sources, represented as signal A source 1 and signal B source 16, from external devices through electrical cabling. In one embodiment, signal 1 may be understood to be differentially related to signal 16 in instances where signal 1 and signal 16 are both available and known to relate to each other in an arithmetically inverse manner, although it is to be understood that a differential relationship is not necessary to carry out the present invention. Other relationships between signals 1 and 16 may be appropriate, for example, if the circuit were to be used as a mixer of signals there may be no relationship between signal 1 and signal 16. Also, signal 1 or signal 16 need not convey a signal at all, and either may be disconnected to apply the device to single ended signals utilizing only two conductors to convey a signal without destroying the effectiveness of the device.

Figure 2:
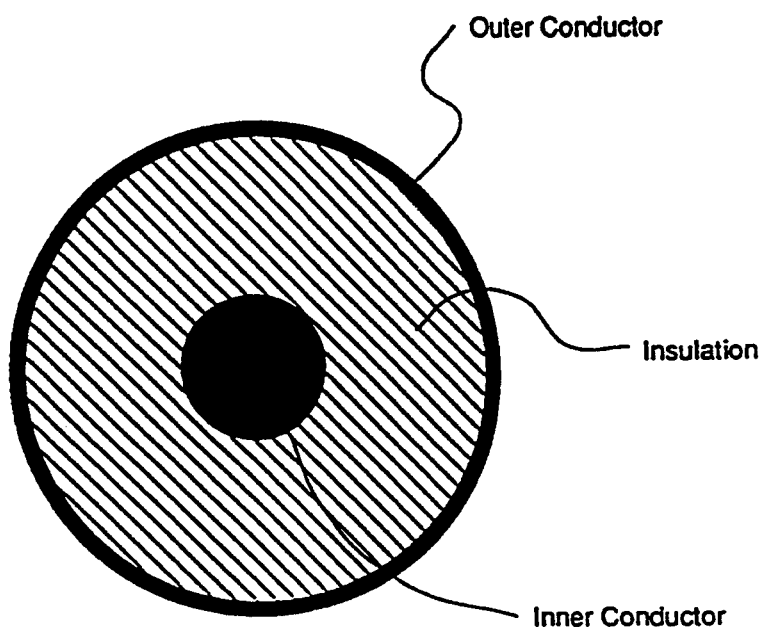
FIG. 2 is a cross-sectional view of a co-axial cable consisting of two conductors illustrating the radial symmetry of co-axial conductors.

Preferably, signal 1 and signal 16 are conveyed over coaxial cables 4 and 19 respectively. Coaxial cables are preferred in connection with this invention because the coaxial nature of the cables offers the special benefit that both conductors respond nearly identically to magnetic field interference by virtue of their high degree of axial symmetry around the major axis of the cable run. In accordance with Lenz's law which relates an induced voltage to the rate of change of magnetic field strength, the outer conductor will respond to magnetic fields in substantially the same way as the inner conductor so as to induce substantially the same voltage in the outer conductor as such interference will induce in the inner conductor. As an example and referring to FIG. 2, the radial symmetry which is used to advantage in the present invention is illustrated. Any electric currents conducted by each shield will tend to raise the reference potential of each signal at its source when the ground potential impedance is not ideal. With signal 1 and signal 16 generated with respect to their own return reference potential, the present invention will more effectively eliminate interference induced because of differences in ground potential brought about by electric field interference or any other source of interference that may be expressed as current flow in the shields of connecting coaxial cables 4 and 19.

Termination resistors 5 and 20 provide loading of the destination which will subdue any currents induced in the signal carrying conductors 4 and 19 by any stray electric fields.

Capacitors 6 and 9 along with resistor 8 and inductor 7 form a Pi-filter arrangement for signal 1, while capacitor 23 and 24 along with resistor 22 and inductor 21 form a Pi-filter arrangement for signal 16, both of which are designed to reject frequencies far higher than the frequencies of interest in the signal. In addition, the Pi-filter arrangements are provided to prevent high frequency interference from interaction with various non-linear elements in typical operational amplifiers and so demodulate or convert such high frequency interference to frequencies that would otherwise interfere with the frequencies of interest.

Continuing to refer to FIG. 1, operational amplifier 64 along with resistors 10 and 11 form a buffer amplifier for signal 1, while operational amplifier 63 along with resistors 25 and 26 form a buffer amplifier for signal 16, both of which are designed to include gain according to the ratio of the values of resistors 10 and 11 for operational amplifier 64 and resistors 25 and 26 for operational amplifier 63. In instances where differential signals are conditioned, these gains should be matched, i.e., the gain for operational amplifier 63 should be substantially equal to the gain for operational amplifier 64. However, in the case of a single input, or multiple unrelated inputs, the precision of the gain of the input stage need not be matched since each input signal 1 and 16, and corresponding operational amplifier 63 and 64 refer to their own ground reference potential 3 and 18 separately, as shown in FIG. 1. In order to refer to each source ground reference potential separately, such as local ground potentials as indicated as 3 and 18, each buffer operational amplifier 63 and 64 should be powered by separate and independent sources of power whose ground return potentials can assume any value signal ground reference potentials 3 and 18 may present by way of the ground conductors of cable 4 and 19. In this configuration, operational amplifiers 63 and 64 can not inject stray currents into the signal carrying conductor, which would be possible through various stray capacitances and internal operational amplifier circuits if the operational amplifiers power supplies did not track the reference ground potential of each input signal.

It should be noted that the signals as presented to the input of operational amplifiers 63 and 64 are subjected to the same phase shift or time delay as any interference presented on the ground conductor of the input. Further, any capacitor in series with the signal path will introduce phase shifts, especially at lower frequencies, which will compromise the suppression and elimination of interference. Preferably, direct coupling of the inputs to operational amplifiers 63 and 64 is utilized to overcome phase shifts induced on input signals 1 and 16. In order to permit each operational amplifier 63 and 64 to operate in a direct coupled manner and to permit each operational amplifier 63 and 64 to handle signals whose potential may be positive or negative with respect to the signal ground return potentials, operational amplifiers 63 and 64 should have separate sources of positive voltage power and negative voltage power with power return connections being made to the same reference ground potential 3 and 18 as presented by each input.

Referring again to FIG. 1, output stage 72 of the signal conditioning apparatus will now be described. Each operational amplifier 63 and 64 provides an intermediate output signal which is proportional to the corresponding input signal 1 and 16 respectively, however, the output signal is provided with a lower output impedance. Hence, circuits may then be connected to the outputs of operational amplifiers 64 and 63, such as resistors 43 through 46, which may inject interference currents into the output of these amplifiers without significant expression of the interference in the signal potential of the outputs of operational amplifiers 63 and 64. The output signals of operational amplifiers 63 and 64 are then appropriately summed along with the local reference potentials of each input signal 1 and 16 presented from grounds 3 and 18, and with the output reference potential 62 as presented by the shield conductor of cable 58.

Operational amplifier 65 provides an output destination signal for the above described summation as follows: The signal from operational amplifier 64 is applied to operational amplifier 65 by way of resistor 43 to provide for the expression of that potential minus the input reference ground potential 3 as presented by the shield conductor of cable 4 by way of resistor 46. Likewise, the signal from operational amplifier 63 is applied to operational amplifier 65 by way of resistor 45 to provide for the expression of that potential minus the input reference ground potential 18 as presented by the shield conductor of cable 19 by way of resistor 44. Resistor 47 provides for the addition of the output reference ground 62 as presented by the shield conductor of cable 58 to the signal output of operational amplifier 65. In this configuration the output potential of operational amplifier 65 may present an output potential that not only calculates the differences between the input potentials and their ground reference return potentials, but also adds in the output reference potential so that the signal then tracks the reference potential used by the sub-system receiving the output of operational amplifier 65.

An illustration of the expression of the summing operation of operational amplifier 65 is as follows:

$$V_{out} - V_{og} = G1 \times G2 \times (((V_{in}+) - (V_{ing}+)) - ((V_{in}-) - (V_{ing}-)))$$

Where $V_{out}$ = Output of operational amplifier 65
$V_{og}$ = Output ground reference potential as presented by the shield of cable 58
$V_{in}+$ = Input from source 1 as presented by cable 4
$V_{ing}+$ = Input ground reference potential from ground 3 as presented by cable 4
$V_{in}-$ = Input from source 16 as presented by cable 19
$V_{ing}-$ = Input ground reference potential from ground 18 as presented by cable 19
G1 = Gain of the buffer amplifiers employing operational amplifiers 63 and 64
G2 = Gain of the summing amplifier employing operational amplifier 65

Preferably, the output of operational amplifier 65 is connected to inductor 55 and resistor 56 to provide a finite, but higher impedance to operational amplifier 65 at higher frequencies than the capacitor 57 or the capacitance of the cable 58 would present at high frequencies, and which would otherwise render operational amplifier 65 unstable in the servo action of operational amplifier 65 gain controlling feedback. Also, inductor 55 provides for very low impedance at lower frequencies so that output cable 58 can be driven with low impedance to short circuit any currents that may be injected by electric fields along cable 58, or by the electrical subsystem that cable 58 may be connected to. In addition, the low output impedance afforded by inductor 55 makes it possible for operational amplifier 65 to more accurately drive any cable capacitance that may be presented by cable 58. This is possible because a higher output impedance, as would be necessary without inductor 55, could result in a low pass RC filter which would be formed by resistor 56 and the combination of capacitor 57 and the capacitance of cable 58. Such an RC filter would have a significant effect on the fidelity of the signal being conveyed.

In addition, capacitors 49 and 50 may also be added to minimize the tendency of some operational amplifiers to amplify higher frequencies in a manner that is not consistent with feedback resistor values, and which could compromise signal fidelity. Capacitor 50 shunts higher frequencies that may be delivered by resistors 45 and 46, while capacitor 49 increases the feedback applied to operational amplifier 65 and shunts higher frequencies that may be delivered by resistors 43 and 44 to the output of operational amplifier 65. Preferably, to minimize the effects of these capacitors in the frequency bands of interest, capacitors 49 and 50 should have values that are inversely proportional to resistors 47 and 48, respectively.

Referring again to FIG. 1, isolating power supply system 74 will now be discussed. Transformers 31 and 32 provide independent alternating current (AC) potentials which are converted to direct current (DC) power potentials for operational amplifiers 63 and 64. Such power supplies, providing positive and negative DC potentials, are commonly referred to as bipolar power supplies. The AC potentials are converted to DC potentials by the rectifier network of diodes 14 and 15 in combination with capacitors 12 and 13 for operational amplifier 64, and the rectifier network of diodes 29 and 30 in combination with capacitors 27 and 28 for operational amplifier 63.

In order to properly track the reference potential, while also driving the signal with respect to that reference potential operational amplifier 65 is provided with a power supply potential having a reference return potential substantially equal to the output reference ground 62 of cable 58. To accomplish this operational amplifier 65 is provided with a separate and independent source of power. Transformer 33 provides AC potential to the rectifier network of diodes 53 and 54 and capacitors 51 and 52, and provides such bipolar power to operational amplifier 65 to present both positive and negative DC signal potentials with respect to the output reference ground 62 as presented by cable 58.

In the preferred embodiment, AC voltages for powering the power supply circuits through transformers 31, 32 and 33, are provided by switching power supply driver 34. Utilization of switching power supply driver 34 reduces the size of the transformers needed to supply power to operational amplifiers 63, 64 and 65. Moreover, smaller transformers may be designed to have lower coupling capacitances between their primary and secondary windings resulting in power supplies that are better able to track the potentials they are connected to.

Capacitor 38 and inductor 37 are provided to synchronize the rate of the power supply switching by applying power supply variations in the vicinity of the switching frequency to the switching rate determining capacitor 39 and rate determining resistor or inductor 40. Synchronization of the power supply switching rate avoids interference caused by standard switching power supplies. Such interference usually in the form of a detectable beat frequency occurs when circuits within the switching power supply switch at different rates.

A problem associated with utilizing switching power supplies is that the switching frequency may interact with the signal to create beat frequencies and cause objectionable distortion in the signal conditioning. Utilization of a switching frequency which is at least twice the value of the highest input signal frequency avoids distortion of the input signal conditioning which may be created by the beat frequency of the switching power supply. In the preferred embodiment, the switching frequency of the switching power supply is at least twice the value of the highest input signal frequency which may be encountered by the signal conditioning apparatus.

Figure 3:
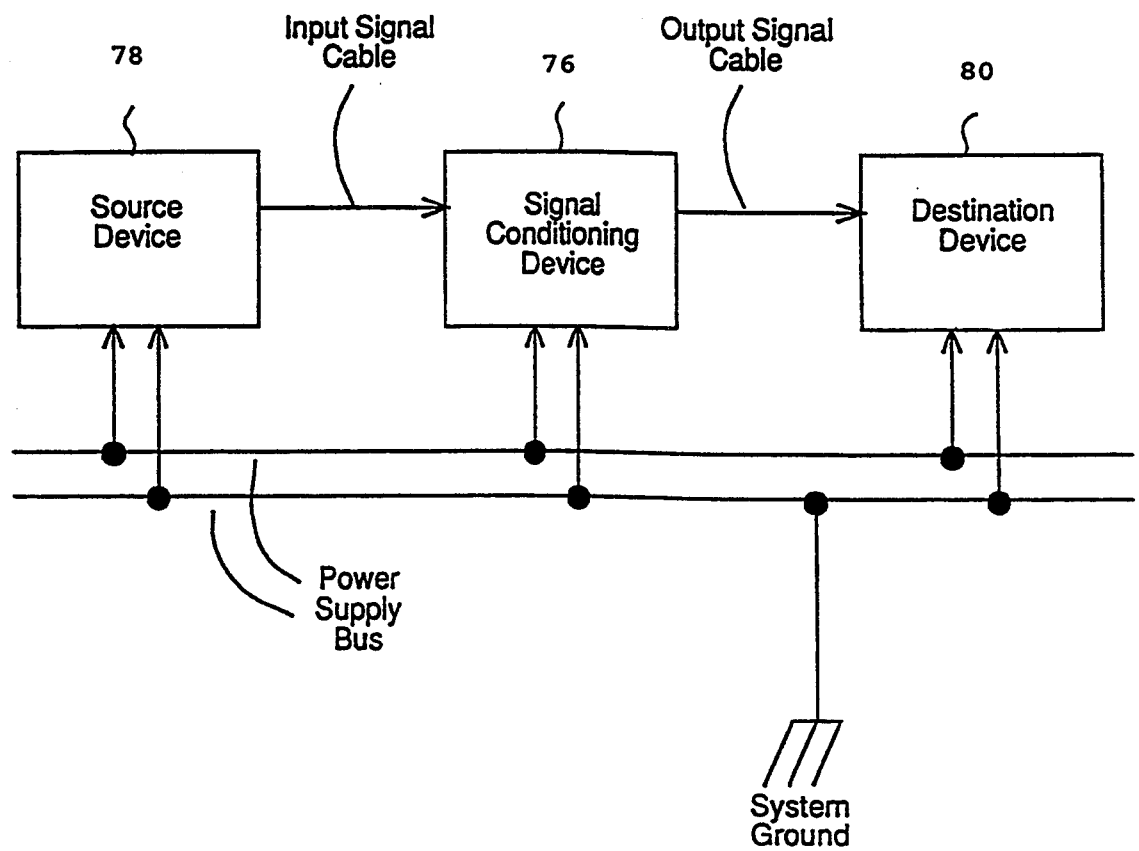
FIG. 3 is a block diagram illustrating the employment of the signal conditioning apparatus of the present invention in a system consisting of a plurality of electronic signal processing devices.

In operation, the signal conditioning apparatus is generally connected between a source device 78 and a destination device 80, as shown in FIG. 3. For illustrative purposes, source device 78 may be a head unit, such as a radio tuner, which produces a low level output signal. The head unit is electrically connected to the signal conditioning apparatus 76, preferably by coaxial cable. Signal conditioning apparatus 76 is electrically connected to destination device 80, preferably by coaxial cable. Destination device 80 may be an amplifier network which supplies an amplified signal from the signal conditioning device to a load, such as speakers.

One problem with signal conditioning apparatus intended to interface between two electronic subsystems (e.g. a source device and a destination device) is the range of different types of inputs that the device will be connected to. Destination devices can vary from having a ground connection that is ultimately connected to the system ground potential to fully isolated differential connections where there are sometimes large impedances between the destination signal ground connection and the system ground. Therefore, the signal conditioning apparatus of the present invention is preferably connected between a source device and destination device so that the destination signal ground connection is connected to the system power return potential, as shown in FIG. 3. Since this is not always the case with all destination devices, additional means to guarantee such a connection may be included in the present invention.

There is often the occasion to provide signal conditioning for more than one signal at a time. In such instances arrays of signal conditioning devices may be required. In such instances the power supplies should all be completely independent in their ability to relate to the required signal ground potentials. With respect to the preferred embodiment, only the primary circuit of the power supply transformer should be shared by such an array of signal conditioning circuits.

The foregoing has set forth exemplary and preferred embodiments of the present invention. It will be understood, however, that various alternatives will occur to those of ordinary skill in the art without departure from the spirit and scope of the present invention.

What is claimed is:

1. A signal conditioning apparatus, which comprises:
    an input portion configured to receive an electrical signal from a single conductor and a corresponding reference signal from a single conductor and for generating an intermediate electrical signal proportional to the potential difference between said received electrical signal and said reference signal; and
    an output portion operatively connected to said input portion to receive said intermediate electrical signal and said reference signal, and having means for generating a destination signal and providing a corresponding destination reference signal such that said destination signal is the resultant of said intermediate electrical signal minus said received reference signal plus said destination reference signal, said output portion having an output connection to facilitate transmission of said destination signal.

2. The apparatus according to claim 1 further comprising noise suppressing means connected between said generating means and said output connection for isolating said destination signal from said output connection.

3. The apparatus according to claim 2, wherein said noise suppressing means reduces the output impedance of said output portion.

4. The apparatus according to claim 3, wherein said noise suppressing means comprises an inductor and a resistor connected in parallel, said inductor and resistor being connected in series with said destination signal.

5. The apparatus according to claim 4, wherein said noise suppressing means further comprises a capacitor connected between said destination signal and said destination reference signal.

6. The apparatus according to claim 1, further comprising:
    first power supply means for providing direct current potential to said input portion; and
    second power supply means for providing direct current potential to said output portion, said second power supply means being isolated from said first power supply means.

7. The apparatus according to claim 6, wherein said first and second power supply means include switching power supplies having a switching frequency higher than the frequency of said received signal.

8. The apparatus according to claim 7, wherein said switching frequency is at least twice as high as said received signal frequency.

9. A signal conditioning apparatus, which comprises:
    an input portion configured to receive a plurality of electrical signals from a corresponding conductor and a plurality of corresponding reference signals from a corresponding conductor and for generating a plurality of intermediate electrical signals corresponding to said plurality of electrical signals, each said intermediate electrical signal being proportional to the potential difference between at least one of said received electrical signals and at least one of said corresponding reference signals; and
    an output portion operatively connected to said input portion to receive said plurality of intermediate electrical signals and said plurality of corresponding reference signals, and having means for generating a destination signal and providing a corresponding destination reference signal representing the resultant of said plurality of intermediate signals minus said plurality of received reference signals plus said destination reference signal, said output portion having an output connection to facilitate transmission of said destination signal.

10. The apparatus according to claim 9 further comprising noise suppressing means connected between said generating means and an output connection for isolating said destination signal from said output connection.

11. The apparatus according to claim 10, wherein said noise suppressing means reduces the output impedance of said output portion.

12. The apparatus according to claim 11, wherein said noise suppressing means comprises an inductor and a resistor connected in parallel, said inductor and resistor being connected in series with said destination signal.

13. The apparatus according to claim 12, wherein said noise suppressing means further comprises a capacitor connected between said destination signal and said destination reference signal.

14. The apparatus according to claim 9, further comprising:
    first power supply means for providing direct current potential to said input portion; and second power supply means for providing direct current potential to said output portion, said second power supply means being isolated from said first power supply means.

15. The apparatus according to claim 14, wherein said first and second power supply means include switching power supplies having a switching frequency higher than the frequency of said received signal.

16. The apparatus according to claim 15, wherein said switching frequency is at least twice as high as said received signal frequency.

17. A signal communication system including a source device, a destination device and a signal conditioning device, said signal conditioning device comprising:

an input portion configured to receive an electrical signal from a single conductor and a corresponding reference signal from a single conductor wherein said conductors are connected to said source device and for generating an intermediate electrical signal proportional to the potential difference between said received electrical signal and said reference signal; and an output portion operatively connected to said input portion to receive said intermediate electrical signal and said reference signal, and having means for generating a destination signal and providing a corresponding destination reference signal such that said destination signal is the resultant of said intermediate electrical signal minus said received reference signal plus said destination return potential signal, said output portion having an output connection to facilitate transmission of said destination signal to said destination device.

18. The signal communication system according to claim 17, wherein said source device is connected to said signal conditioning device by coaxial cable.

19. The signal communication system according to claim 17, wherein said destination device is connected to said signal conditioning device by coaxial cable.

20. The signal communication system according to claim 17 further comprising means for connecting said destination reference potential signal to system ground at the destination device.

* * * * *